United States Patent [19]

Newell et al.

[11] Patent Number: 5,177,458
[45] Date of Patent: Jan. 5, 1993

[54] DIELECTRIC FILTER CONSTRUCTION HAVING NOTCHED MOUNTING SURFACE

[75] Inventors: Michael A. Newell, Lake Zurich; Jin D. Kim, Chicago; Michael F. Moutrie, Buffalo Grove, all of Ill.

[73] Assignee: Motorola, Inc., Schaumburg, Ill.

[21] Appl. No.: 738,392

[22] Filed: Jul. 31, 1991

[51] Int. Cl.$^5$ ............................................. H01P 1/202
[52] U.S. Cl. ................................. 333/206; 333/134
[58] Field of Search ............. 333/202, 206, 207, 222, 333/246, 134; 361/414, 412, 399, 401; 455/78

[56] References Cited

U.S. PATENT DOCUMENTS 5,023,580  6/1991  Kim et al. ................... 333/202 X
5,045,824  9/1991  Metroka .......................... 333/206

FOREIGN PATENT DOCUMENTS 0081303  5/1983  Japan ............................ 333/202
0043904  2/1987  Japan ............................ 333/202
0190405  8/1988  Japan ............................ 333/222

Primary Examiner—Paul M. Dzierzynski
Assistant Examiner—Seung Ham
Attorney, Agent, or Firm—Robert H. Kelly

[57] ABSTRACT

A dielectric block filter assembly which is surface-mounted upon a circuit board. The circuit board includes an opening formed to extend therethrough, and parallel-extending projecting members, formed of a portion of the printed circuit board, which extend into the opening formed to extend through the circuit board. The dielectric block filter includes a bottom mounting surface having notches corresponding to the projecting members. Each notch includes a seating surface for seating against corresponding ones of the projecting members in mated engagement therewith.

10 Claims, 4 Drawing Sheets

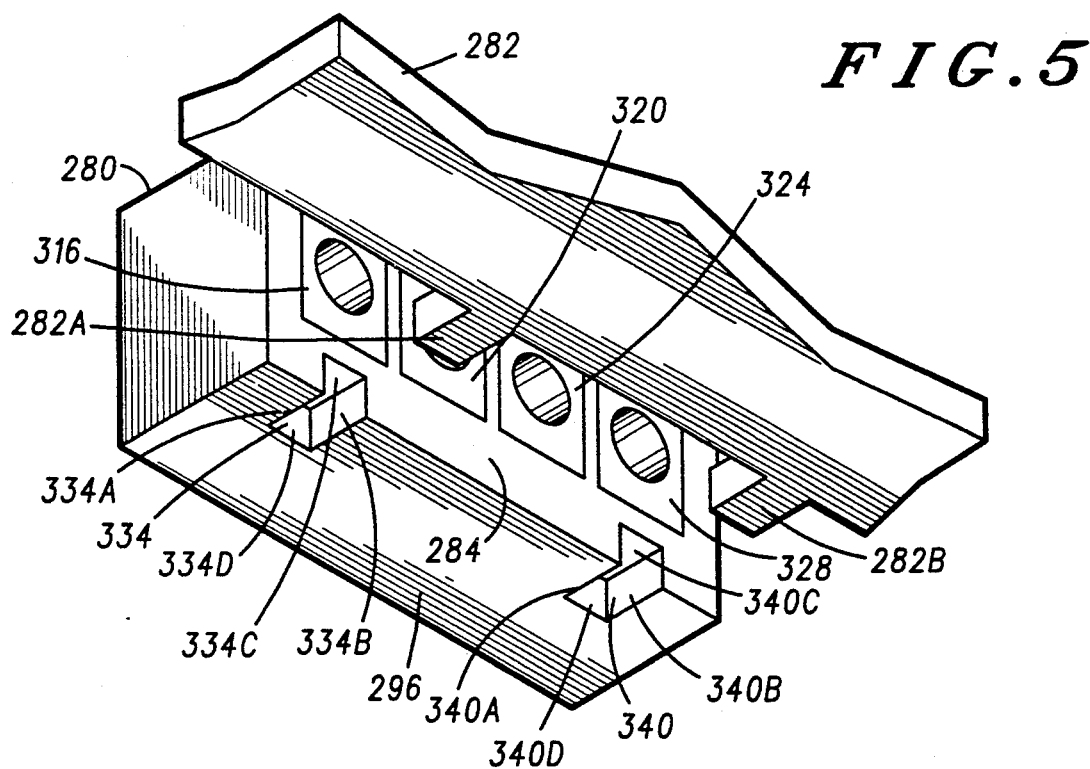
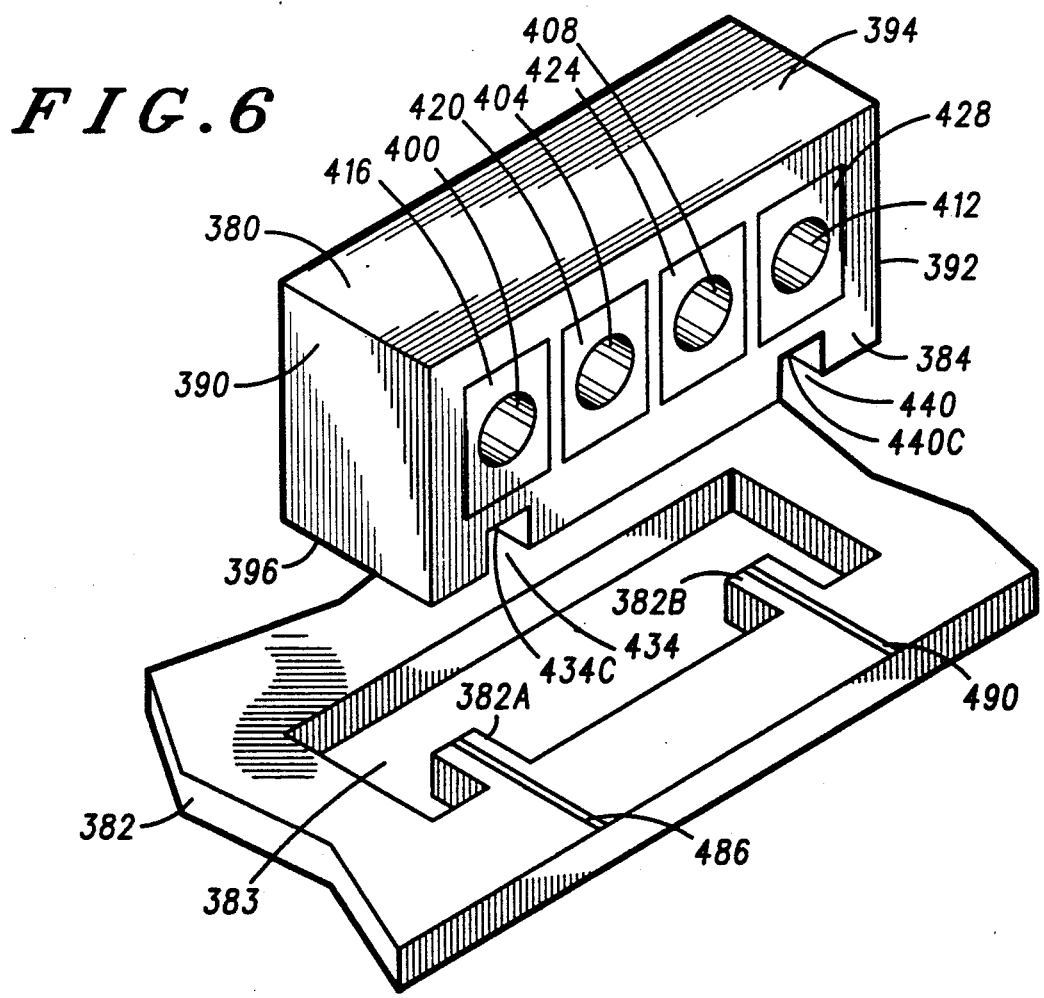

DIELECTRIC FILTER CONSTRUCTION HAVING NOTCHED MOUNTING SURFACE

BACKGROUND OF THE INVENTION

The present invention relates generally to dielectric filters, and, more particularly, to a dielectric filter which may be surface-mounted upon a substrate, such as a printed circuit board.

A filter circuit is operative to generate a filtered signal responsive to application of an input signal thereto. Component portions of the input signal which are of frequencies beyond a pass band of the filter circuit are filtered by the filter circuit; such component portions of the input signal do not form a portion of the filtered signal generated by the filter circuit. Conventional filter circuits include, for example, band pass, band reject, low pass, and high pass filter circuits. One or more filter circuits typically comprise a portion of an electrical circuit.

While filter circuits may be comprised of any of many varied types of materials, filter circuits are generally classified according to the type of material utilized to construct the filters. More particularly, filter circuits may be comprised of either active or passive filter components. Accordingly, a filter circuit is generally classified as forming either an active filter or a passive filter.

An active filter component may be advantageously embodied in an integrated circuit, but an active filter circuit formed of such active components is generally linear over only a limited dynamic range. Accordingly, an active filter circuit comprised of active filter components exhibits proper filter characteristics over only the limited dynamic range in which the active filter circuit is linear.

Passive filter circuits comprised of passive filter components, e.g., combinations of conventional, discrete resistors, capacitors, and inductors are, conversely, linear over a greater dynamic range. The resistive, capacitive, and inductive component values of the passive filter components, and their electrical connections therebetween, define filter characteristics of the filter circuit formed therefrom. The passive filter components comprising the passive filter circuit may be connected in manners, and may be of resistive, capacitive, and inductive values, to form a filter circuit, such as any of the above-listed filter circuits. Because such passive filter circuits are linear over the greater dynamic range, passive filter circuits are utilized when proper filter characteristics are desired over the greater dynamic range. In many instances, therefore, filter circuits are comprised of passive filter components to form passive filters.

When a filter circuit forming a portion of an electrical circuit is positioned in a series connection with the electrical circuit, component portions of an input signal applied to the filter circuit within a resonant frequency of the filter circuit, are passed by the filter circuit. The resonant frequency of a filter circuit is determined by the component values of the components forming the filter circuit and their respective electrical connections therebetween. By appropriate selection of the component values of the components of the filter circuit as well as their electrical connections therebetween, component portions of an input signal applied to the filter circuit of frequencies within any desired range of frequencies may be passed by the filter circuit.

When a filter circuit forming a portion of an electrical circuit is positioned in a shunt connection with the electrical circuit, component portions of an input signal applied to the filter circuit within the resonant frequency of the filter circuit are shunted to ground by the filter circuit. By appropriate selection of the component values of the components of the filter circuit as well as their electrical connection therebetween, component portions of an input signal applied to the filter circuit of frequencies within any desired range of frequencies may be shunted by the filter circuit.

Electrical circuits forming radio receivers, radio transmitters, and radio transceivers all include filter circuits forming portions thereof. For instance, filter circuitry is utilized in radio receiver circuits to tune the receiver, and to filter a signal of unwanted signal portions generated during down conversion and/or demodulation of a signal received by the receiver.

Dielectric filters, comprised of ceramic and other dielectric filter components, are oftentimes utilized to form passive filter circuits. When formed of the ceramic material, such filter circuits are generally referred to as ceramic block filters due to the geometrical configuration of most of such filters. Such ceramic block filters are advantageously utilized to form portions of an electrical circuit as a single ceramic block forms the filter circuit. Typically, one or more cavities are drilled or otherwise created to extend through the ceramic block, and the side walls defining the cavities are coated with an electrically-conductive material. Surface portions of the ceramic block are also typically coated with the electrically-conductive material. Once coated with the electrically-conductive material, the cavities form resonators of characteristics defined by the lengths and the surface areas of the side walls which define the resonator. U.S. Pat. Nos. 4,431,977; 4,742,562; 4,673,902; 4,703,291; and 4,716,391 all disclose such ceramic block filters.

Care must be exercised to ensure that the ceramic block filter is properly connected to the electrical circuit. In some instances, coaxial cables are soldered to portions of the ceramic block filter to effectuate such connection. In other instances, such as that disclosed in U.S. Pat. No. 4,673,902, the ceramic block filter is coupled directly to the electrical circuit by a direct, solder connection. Because the ceramic block filter is susceptible to movement when the solder liquefies during solder reflow operations, such existing manner of connecting the ceramic block filter to an electrical circuit can, however, result in inadequate electrical connection of the ceramic block filter to the electrical circuit.

U.S. patent application Ser. No. 577,172 (now U.S. Pat. No. 5,045,824), filed on Sep. 4, 1990, and entitled, "Dielectric Filter Construction," discloses a ceramic block filter mountable upon a multi-layer circuit board having a mounting surface which matingly engages with a corresponding mating area formed on a top layer of the multi-layered circuit board. Problems associated with movement of the ceramic block filter occurring during solder reflow operations are obviated as the mated engagement of the ceramic block with the circuit board prevents movement of the ceramic block.

A dielectric filter construction mountable upon any type of circuit board which is similarly not susceptible to movement during solder reflow operations would be advantageous.

Care must also be exercised during design of electrical circuits which include such ceramic block filters as such ceramic blocks are conventionally mounted upon circuit boards. When circuit boards are stacked above one another, or when a single circuit board is housed within an enclosed housing, spacing of lengths at least as great as the heights of the ceramic blocks is required to permit positioning of the ceramic block upon the circuit board.

Disclosed in U.S. Pat. No. 5,023,580 is a dielectric block filter mountable upon a circuit board wherein the filter extends through an opening formed through the circuit board. The filter is supported in position by a bracket. As a portion of the ceramic block rests beneath the top surface of the circuit board, the spacing required above the circuit is reduced.

SUMMARY OF THE INVENTION

The present invention advantageously provides a dielectric block filter assembly which may be surface mounted upon a circuit board, but which reduces the heightwise spacing required to position the dielectric block filter upon a circuit board.

The present invention further advantageously provides a dielectric block filter which may be matingly engaged with a circuit board to prevent movement during solder reflow operations used to connect electrically the filter to an electrical circuit.

The present invention still further advantageously provides a dielectric block filter in which the capacitive coupling thereof with an electrical circuit may be precisely controlled.

The present invention yet further advantageously provides a dielectric block filter which may be disposed upon a printed circuit board of a transceiver having both receiver circuitry and transmitter circuitry.

The present invention provides further advantages and features, the details of which will become more apparent by reading the detailed description of the preferred embodiments hereinbelow.

In accordance with the present invention, therefore, a filter assembly is disclosed. A substrate includes a recess extending therein which defines an opening upon a top surface of the substrate. The substrate has at least one projecting member projecting into the opening defined by the recess. At least one electrically-conductive transmission line is disposed upon the substrate, wherein the at least one transmission line formed thereby has portions thereof disposed upon the at least one projecting member of the substrate. A dielectric block has at least one cavity extending along at least a portion of the length of the dielectric block. Side walls defining the cavity are coated with an electrically-conductive material to form a resonator of the cavity thereby. The dielectric block has a mounting surface formed of an outer surface thereof of dimensions permitting insertion of at least a portion thereof into the recess formed to extend into the substrate. The mounting surface further has at least one notch, defined by opposing side wall surfaces and a seating surface extending therebetween, which corresponds to the at least one projecting member of the substrate to permit mated engagement with the at least one projecting member thereby when the seating surface of the at least one notch is seated against the projecting member.

BRIEF DESCRIPTION OF THE DRAWINGS

The present invention will be better understood when read in light of the accompanying drawings in which:

FIG. 5 is an exploded, cutaway view of a filter of a preferred embodiment of the present invention, similar to that shown in FIG. 3, illustrating the relationship between the filter and projecting members forming a portion of a circuit board;

FIG. 6 is another exploded, cut away view of a filter of a preferred embodiment of the present invention positioned above a circuit board;

DESCRIPTION OF THE PREFERRED EMBODIMENTS

Figure 1:
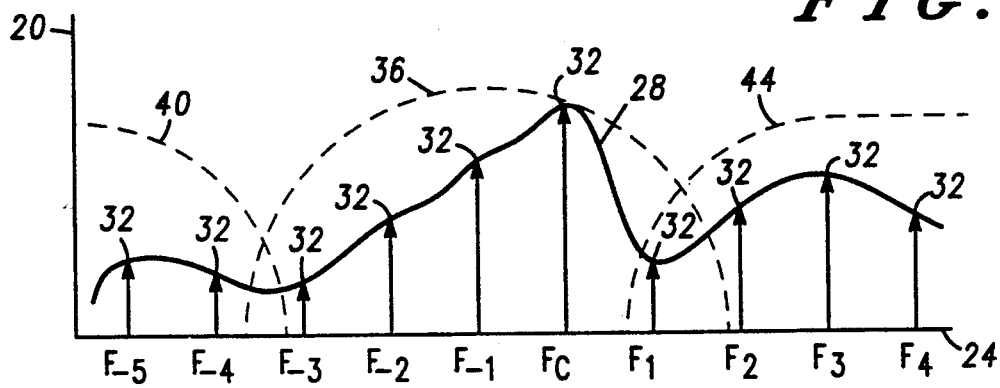
FIG. 1 is a graphical representation of a signal plotted as a function of frequency which may be filtered by the filter of the present invention.

Turning first to the graphical representation of FIG. 1, a typical broadband signal is plotted as a function of frequency. The magnitude of the signal is plotted upon ordinate axis 20 (axis 20 is scaled in terms of, e.g., decibels or decibels per milliwatt) as a function of frequency upon abscissa axis 24 (axis 24 is scaled in terms of hertz). The broadband signal, represented by envelope 28, is actually comprised of a plurality of component portions, indicated in the Figure by spikes 32. Although the component portions of the broadband signal are represented in the Figure by single-frequency spikes 32, it is to be understood that the component portions may be formed of a range of bandwidths having a center, or average frequency, denoted by the frequencies defining each of the spikes 32.

A filter is operative to pass, or to reject, certain component portions of a signal applied thereto. Envelope 36, shown in hatch in FIG. 1, represents a pass band of a band pass filter which passes component portions of a signal of frequencies within the pass band of the filter. Component portions of the signal which are beyond the frequencies defining the pass band of the filter are not passed by the filter. Envelope 40, also shown in hatch in FIG. 1, represents a pass band of a low pass filter which passes component portions of a signal which are within the range of frequencies defining the pass band of the low pass filter. Component portions of frequencies beyond the pass band of the low pass filter are not passed. Similarly, envelope 44, also shown in hatch in FIG. 1, represents a pass band of a high pass filter which passes component portions of a signal applied thereto within the range of frequencies defining the high pass filter. Component portions of the signal applied thereto of frequencies beyond the pass band of the filter are not passed.

Figure 2:
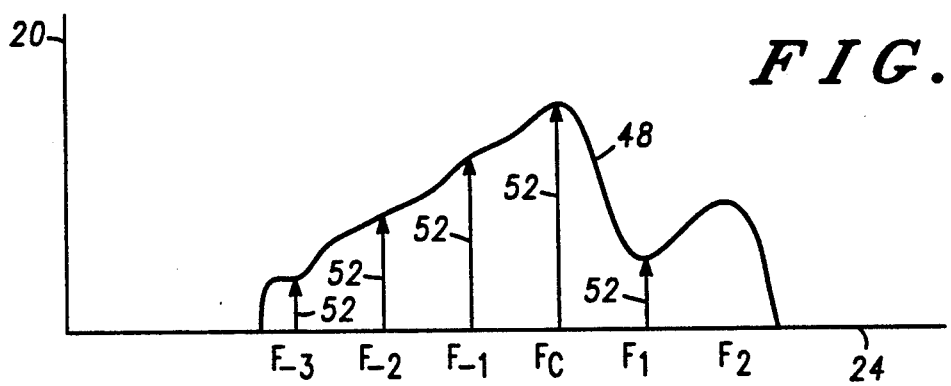
FIG. 2 is a graphical representation, similar to that of FIG. 1, but illustrating a filtered signal formed by a filter constructed according to a preferred embodiment of the present invention.

FIG. 2 is a graphical representation, similar to that of FIG. 1, wherein again, the magnitude of a signal is plotted on ordinate axis 20 as a function of frequency on abscissa axis 24. A filtered signal, represented by envelope 48 and comprised of component portions denoted by spikes 52, is plotted thereupon. The filtered signal, represented by envelope 48, is representative of a signal passed by a band pass filter having a pass band of a range of frequencies corresponding to envelope 36 of FIG. 1. Filtered signals generated by filters having other pass bands may similarly be represented.

Figure 3:
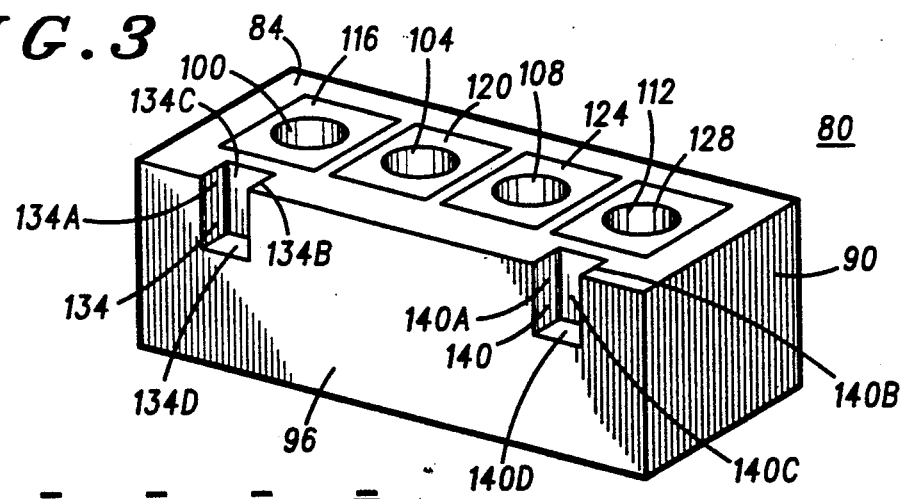
FIG. 3 is a perspective view of a filter of a preferred embodiment of the present invention.

Turning now to the perspective view of FIG. 3, a filter, referred to generally by reference numeral 80, of a preferred embodiment of the present invention is shown. While, in the preferred embodiment, filter 80 is generally block-like in construction, alternate geometric configurations are similarly possible. Filter 80 forms a dielectric block, and is comprised of a high-dielectric, low-loss ceramic material. The ceramic material may, for example, be comprised of a ceramic compound including barium oxide, zirconium oxide, or titanium oxide.

Filter 80 defines six surfaces, of which three are shown in the perspective view of FIG. 3, namely, front surface 84, first side surface 90, and bottom, mounting surface 96. Four cavities are drilled, or otherwise formed, to extend at least part of the way through the body of filter 80. The cavities define openings 100, 104, 108, and 112 upon front surface 84. Sidewalls defining the cavities extending through the body of filter 80 are coated with an electrically-conductive material to form resonators of the cavities. Circumferential portions of openings 100–112 are additionally coated with the electrically-conductive material to form electrodes 116, 120, 124, and 128. Electrodes 116–128 are electrically isolated from each other as uncoated portions of surface 84 form interstitial strips between adjacent ones of the electrodes 116–128; the electrodes are, however, electrically coupled to the electrically-conductive material coating the sidewalls which define the respective ones of the cavities. First side surface 90 and bottom mounting surface 96 (as well as the other surfaces of filter 80 which are not illustrated in the isometric view of FIG. 3) are preferably also coated with the electrically-conductive material.

Bottom mounting surface 96 further includes notches, referred to generally by reference numerals 134 and 140, formed therein. Notches 134 and 140 are defined by sidewalls 134A and 134B, and sidewalls 140A and 140B, respectively. Sidewalls 134A and 134B are spaced apart by a distance defined by seating surface 134C; similarly, sidewalls 140A and 140B are separated by seating surface 140C.

As, in the preferred embodiment, notches 134 and 140 do not extend transversely along the entire length of filter 80, but, rather, extend only part of the width of bottom mounting surface 96, rear sidewalls 134D and 140D also separate sidewalls 134A–B and 140A–B. At least one of the sidewalls and/or surfaces defining notches 134 and 140 is coated with an electrically-conductive material. Preferably, and as illustrated, seating surfaces 134C and 140C are coated with the electrically-conductive material. Seating surface 134C is thereby capacitively coupled to electrodes 116–128, and seating surface 140C is capacitively coupled to electrodes 116–128. The extent of the capacitive coupling between seating surfaces 134C and the electrodes 116–128, and the capacitive coupling between seating surface 140C and electrodes 116–128 is dependent upon the surface areas of the respective surfaces and electrodes, as well as their respective distances therebetween.

The depths of notches 134 and 140, as determined by the heights of sidewalls 134A, B, and D, and the depths of sidewalls 140A, B, and D, are determinative of the distances between seating surfaces 134C and 140C with electrodes 116–128, and, hence, the capacitive couplings therebetween. As the magnitude of the capacitive coupling between the seating surfaces and the electrodes is inversely proportional to the respective separation distances therebetween, the capacitive couplings between seating surface 134C and electrode 116, and between seating surface 140C and electrode 128, are of the greatest magnitudes. (Coupling is additionally present between the seating surfaces 134C and 140C, respectively, and the electrically-conductive material coating the cavities.) As the magnitudes of the capacitive couplings may be controlled by determining the depths of notches 134 and 140, the magnitudes of such couplings may be precisely predetermined.

Figure 4:
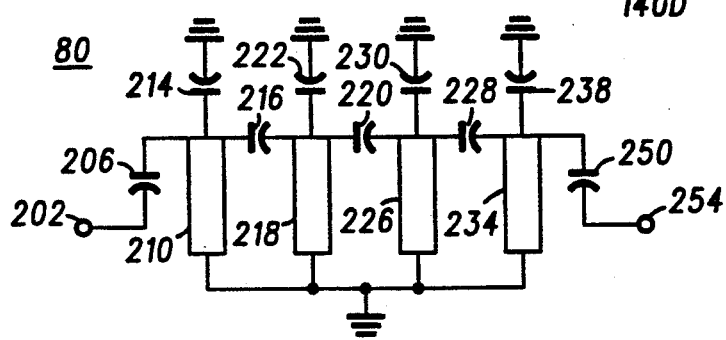
FIG. 4 is an electrical equivalent circuit of the filter of FIG. 3.

Turning now to the electrical, schematic circuit of FIG. 4, an electrical equivalent circuit of filter 80 is shown. An input signal is supplied to the circuit at node 202 which corresponds to seating surface 134C of FIG. 3. A side of capacitor 206 is coupled to node 202, and corresponds with the capacitive coupling of seating surface 134C and electrode 116 formed upon front surface 84 of filter 80. A second side of capacitor 206 is coupled to shorted transmission line 210.

Shorted transmission line 210 corresponds to a first resonator formed of a cavity extending through filter 80. Shorted transmission line 210 is of a specific resistive, capacitive, and inductive value. Shunt capacitor 214 extends between shorted transmission line 210 and ground and corresponds to a capacitive coupling between electrode 116 and side surface portions (including first side surface 90 and bottom mounting surface 96 shown in FIG. 3) of filter 80.

Shorted transmission line 210 is coupled, through capacitor 216 to shorted transmission line 218, which, similar to shorted transmission line 210, corresponds to a resonator formed of a cavity extending through filter 80. Capacitor 216 represents the capacitive couplings between adjacent electrodes 116 and 120. Shunt capacitor 222 extends between shorted transmission line 218 and ground, and analogous to capacitor 214, corresponds to the capacitive coupling of electrode 120 and portions of the side surfaces of filter 80.

In a similar manner, shorted transmission lines 226 and 234 correspond to resonators formed by cavities extending through filter 80. Capacitors 220 and 228 correspond to capacitive couplings between electrodes 120 and 124, and electrodes 124 and 128, respectively. and, capacitors 230 and 238 correspond to the capacitive couplings between electrode 124 and side surface portions of filter 80 and between electrode 128 and side surface portions of filter 80, respectively.

Capacitor 250 represents the capacitive coupling between electrode 124 and seating surface 140C, and node 254 represents seating surface 140C at which a filter output signal is generated by filter 80. Second sides of resonators 210-234 are preferably coupled to ground, as represented by the coupling of sides of capacitors 214, 222, 230, and 238 of FIG. 4 to ground. While FIG. 3 does not illustrate a back surface (positioned at a side of filter 80 opposite to that of front surface 84), such coupling of second sides of resonators 210-234 to ground is accomplished by the electrically-conductive material coated upon the back surface of filter 80 interconnecting electrically the resonators 210-234, and appropriate coupling of the back surface to a ground plane.

Turning now to the exploded, cut away view of FIG. 5, filter 280 of the present invention is positioned above a printed circuit board, here referred to generally by reference numeral 282. Filter 280 is identical in all respects to that of filter 80 of FIG. 3. Bottom mounting surface 296 of filter 28 contains notches 334 and 340 formed therein. Notches 334 and 340, analogous to notches 134 and 140 of filter 80 FIG. 3, are defined by sidewalls separated by seating surfaces. Sidewalls 334B and 340B, seating surfaces 334C and 340C, and, also, rear sidewalls 334D and 340D are shown in the view of FIG. 5.

Electrically-conductive material coats sidewalls defining cavities extending through filter 280. The electrically-conductive material additionally coats peripheral portions of openings defined by the cavities upon front surface 284 to form electrodes 316, 320, 324, and 328. The electrically-conductive material further coats seating surfaces 334C and 340C. Seating surfaces 334C and 340C are thereby capacitively coupled to electrodes 316 and 328, respectively.

Printed circuit board 282 includes two parallel-extending, bar-shaped projecting members 282A and 282B. Projecting members 282A and 282B are of dimensions and are spaced-apart by distances corresponding to the dimensions of, and the distance separating notches 334 and 340 of filter 280. Projecting members 282A and 282B thereby are permitted mated engagement with notches 334 and 340, respectively. More particularly, seating surface 334C of notch 334 seats against a top surface of projecting member 282A, and seating surface 340C of notch 340 seats against a top surface of projecting member 282B.

A portion of filter 280 extends beneath a top surface of circuit board 282 when seating surfaces 334C and 340C seat against top surfaces of projections 282A and 282B. As a result, a top surface of filter 280 is positioned above the top surface of circuit board 282 at a distance less than if the bottom surface 296 of the filter rested directly upon the top surface of circuit board 282.

Turning now to the exploded, cutaway view of FIG. 6, filter 380 of the present invention is positioned above circuit board 382. Opening 383 is formed to extend through circuit board 382. Bar-shaped projecting members 382A and 382B of circuit board 382 extend into opening 383. Filter 380 is identical to filters 80 and 280 of FIGS. 3 and 5, respectively. Filter 380 comprises front surface 384, side surfaces 390 and 392, top surface 394, and bottom mounting surface 396. Cavities extending through filter 380 define openings 400, 404, 408, and 412 upon front surface 384. Sidewalls defining the cavities are coated with an electrically-conductive material, and such electrically-conductive material is further coated about peripheral portions of openings 400-412 to form thereby electrodes 416, 420, 424, and 428. Notches 434 and 440 are formed in bottom mounting surface 396. Notch 434 includes seating surface 434C and notch 440 includes seating surface 440C.

Circuit board 382 includes a recessed area extending through the circuit board to define opening 383 thereby. Parallel-extending, bar-shaped, projecting members 382A and 382B extend into the opening defined by the recessed area extending through circuit board 382. Similar to the relationship between projecting members 282A and notch 334, and projecting member 282B and notch 340, of FIG. 5, projecting members 382A-B are positioned, and are of dimensions, to permit mated engagement with notches 434 and 440 of filter 380. Opening 383 is of dimensions permitting insertion therein of bottom mounting surface 396 of filter 380. Once seating surfaces 434C and 440C of notches 434 and 440, respectively, seat against top surfaces of projecting members 482A and 482B, continued translation of filter 380 through opening 383 of circuit board 382 is prevented.

Printed upon projecting members 382A and 382B are transmission lines 486 and 490. Transmission lines are comprised of an electrically-conductive material, and, preferably, form solder paths of an electrical circuit disposed upon circuit board 382.

When seating surfaces 334C and 340C seat against top surfaces of projecting members 382A and 382B, the electrically-conductive material coating the seating surfaces 334C and 340C are electrically connected with the transmission lines 486 and 490 disposed upon the projecting members 382A-B. Transmission lines 486 and 490 are thereby capacitively coupled to electrodes 416 and 428. Additionally, because a portion of filter 380 is disposed beneath the top surface of circuit board 382, top surface 394 of filter 380 is positioned above the top surface of circuit board 382 at a distance less than if the bottom surface 396 of the filter rested directly upon the top surface of circuit board 282.

Figure 7:
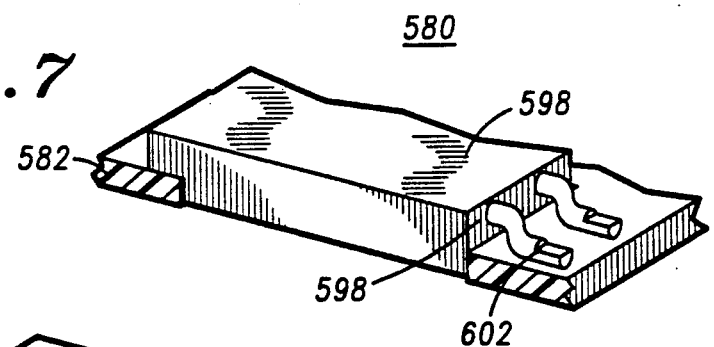
FIG. 7 is a cut away view of a filter of a preferred embodiment of the present invention mounted upon a circuit board and supported in position by a mechanical support rod.

Turning now to the perspective, cutaway view of FIG. 7, a filter constructed according to the teachings of the present invention, and here referred to generally by reference numeral 580, is mounted upon circuit board 582. Filter 580 is identical to filters 80, 280, and 380 illustrated in preceding Figures. Accordingly, while not shown in the view of FIG. 7, filter 580 includes notches having seating surfaces permitting mated engagement with projecting members (also not shown in FIG. 7) forming a portion of circuit board 582. Back surface 598 of filter 580 is illustrated in the view of FIG. 7, and an opening defined by a cavity extending through filter 580 is formed upon back surface 598. A first side of rod members 602 is inserted into the opening formed on the back surface 598 of the filter. A second side of rod member 602 rests upon a top surface of circuit board 582. Rod member 602 is operative to support filter 580 at a side thereof opposite that of the side of filter 580 which seats against the projecting members of circuit board 582. Rod member 602 is preferably, and as illustrated, bifurcated in configuration to align properly filter 580 at a desired angle. The side of rod member 602 which rests upon the top surface of circuit board 582 may additionally be soldered thereto to affix rod member 602 in position thereby.

Figure 8:
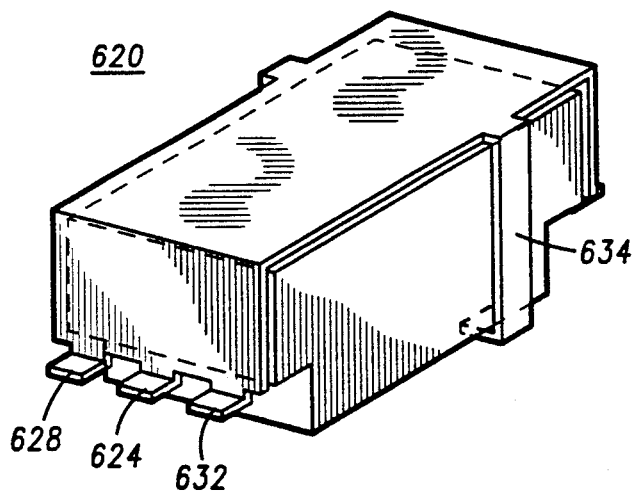
FIG. 8 is a perspective view of a bracket which forms a portion of an alternate preferred embodiment of the present invention to support a filter, such as those shown in the preceding Figures, when mounted upon a circuit board.

FIG. 8 is a perspective illustration of a bracket member, here referred to generally by reference numeral 620 which may alternately be utilized to support the dielectric filter such as those shown in the previous Figures (namely, filters 80, 280, 380, and 580), when the filter is inserted into the opening formed by the recessed area extending into a circuit board. Bracket member 620 is of dimensions also to permit insertion thereof into the opening formed of the recessed area extending into the circuit board. Bracket member 620 includes outwardly-projecting tabs 624, 628, and 632 which abut, at bottom surfaces thereof, against the top surface of a circuit board in supportive engagement thereupon. Similar tabs are positioned at an opposite side of bracket 620. Strap members, such as strap member 634 extend beneath the dielectric filter to support the filter thereby. A dielectric filter is positioned within bracket 620, and then the assembly, comprised of both the bracket and the filter, is inserted into an opening in a circuit board such that tabs 624-632 abut against the circuit board. Thereby, the side of the filter opposite that which is seated against the projecting members of the circuit board is supported in position by bracket member 620.

Figure 9:
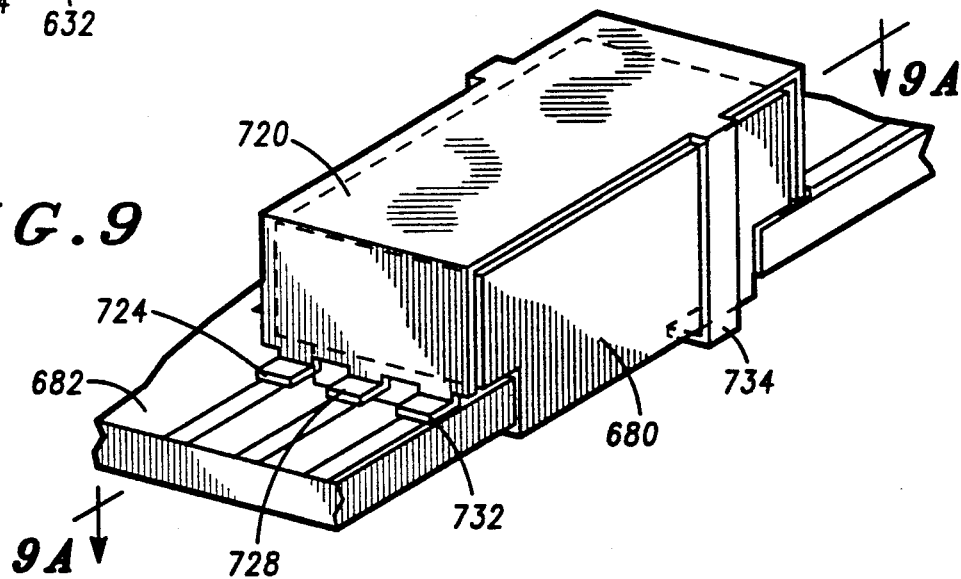
FIG. 9 is a perspective view of the filter of a preferred embodiment of the present invention mounted upon a circuit board and supported in position by a bracket.

FIG. 9 is a perspective illustration of a dielectric filter of the present invention, here referred to by reference numeral 680, positioned to extend into an opening formed of a recessed area extending through printed circuit board 682. Bracket 720, similar to bracket 620 of FIG. 8, is additionally inserted into the opening formed by the recessed area. Tab members 724, 728, and 732 abut against a top surface of circuit board 682 to support the bracket in position thereat. A side of filter 680 opposite that of the side of the filter having the notches which seat against projecting members forming a portion of circuit board 682 is supported by bracket member 720.

Figure 9A:
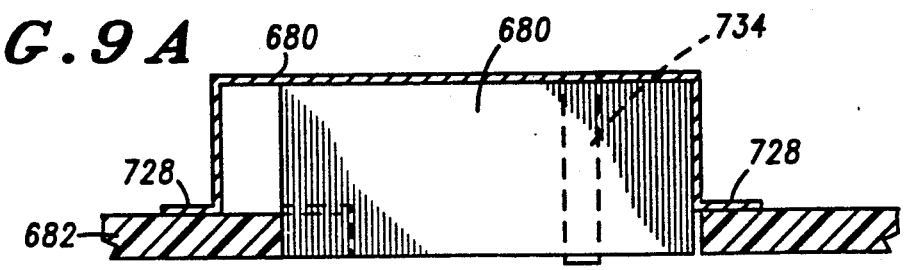
FIG. 9A is a sectional view taken along line A—A of FIG. 9.

FIG. 9A is a sectional view taken along line A—A of FIG. 9, and illustrates the relationship between filter 680, bracket 720, and circuit board 682. Tabs 728 positioned at both ends of bracket 720 are illustrated in FIG. 9A in abutting engagement upon a top surface of circuit board 682.

Figure 10:
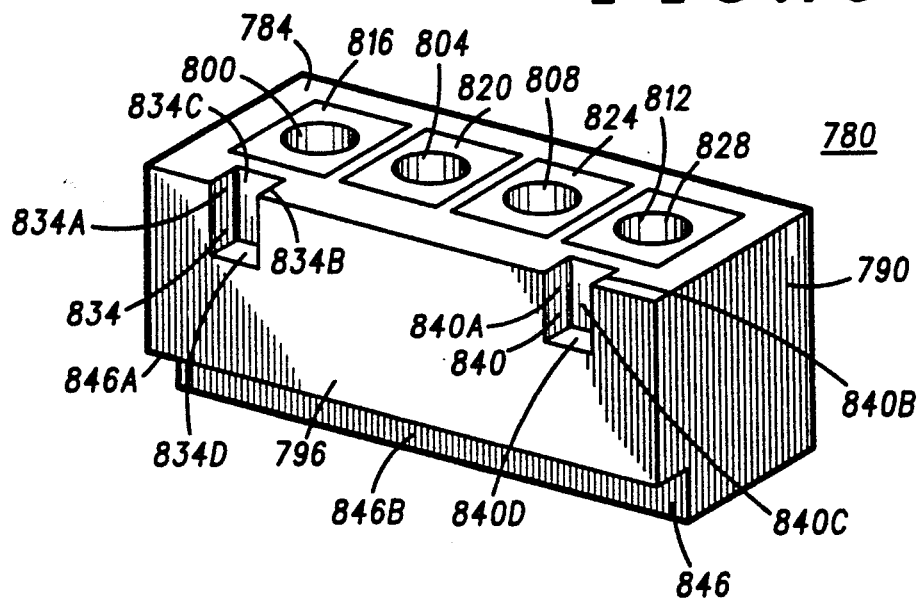
FIG. 10 is a perspective view of a filter of an alternate, preferred embodiment of the present invention.

Turning now to the perspective view of FIG. 10, a filter, referred to generally by reference numeral 780, of another preferred embodiment of the present invention is shown. While, in the preferred embodiment, filter 780 is generally block-like in construction, alternate geometric configurations are similarly possible. Filter 780 forms a dielectric block, and is comprised of a high-dielectric, low-loss ceramic material. The ceramic material may, for example, be comprised of a ceramic compound including barium oxide, zirconium oxide, or titanium oxide.

Filter 780 defines six surfaces, of which three are shown in the perspective view of FIG. 10, namely, front surface 784, first side surface 790, and bottom, mounting surface 796. Four cavities are drilled, or otherwise formed, to extend at least part of the way through the body of filter 780. The cavities define openings 800, 804, 808, and 812 upon front surface 784. Sidewalls defining the cavities extending through the body of filter 780 are coated with an electrically-conductive material to form resonators of the cavities. Circumferential portions of openings 800-812 are additionally coated with the electrically-conductive material to form electrodes 816, 820, 824, and 828. Electrodes 816-828 are electrically isolated from each other as uncoated portions of surface 784 form interstitial strips between adjacent ones of the electrodes 816-828. First side surface 790 and bottom mounting surface 796 (as well as the other surfaces of filter 780 which are not illustrated in the isometric view of FIG. 10) are preferably also coated with the electrically-conductive material.

Similar to filter 80 of FIG. 3, bottom mounting surface 796 further includes notches, referred to generally by reference numerals 834 and 840, formed therein. Notches 834 and 840 are defined by sidewalls 834A and 834B, and sidewalls 840A and 840B, respectively. Sidewalls 834A and 834B are spaced apart by a distance defined by seating surface 834C; similarly, sidewalls 840A and 840B are separated by seating surface 840C.

Notches 834 and 840 do not extend transversely along the entire length of filter 780, but, rather, extend only part of the width of bottom mounting surface 796, rear sidewalls 834D and 840D also separate sidewalls 834A-B and 840A-B. At least one of the sidewalls and/or surfaces defining notches 834 and 840 is coated with an electrically-conductive material. Preferably, and as illustrated, seating surfaces 834C and 840C are coated with the electrically-conductive material. Seating surface 834C is thereby capacitively coupled to electrodes 816-828, and seating surface 840C is capacitively coupled to electrodes 816-828. The extent of the capacitive coupling between seating surfaces 834C and the electrodes 816-828, and the capacitive coupling between seating surface 840C and electrodes 816-828 is dependent upon the surface areas of the respective surfaces and electrodes, as well as their respective distances therebetween.

The depths of notches 834 and 840, as determined by the heights of sidewalls 834A, B, and D, and the depths of sidewalls 840A, B, and D, are determinative of the distances between seating surfaces 834C and 840C with electrodes 816-828, and, hence, the capacitive couplings therebetween. As the magnitude of the capacitive coupling between the seating surfaces and the electrodes is inversely proportional to the respective separation distances therebetween, the capacitive couplings between seating surface 834C and electrode 816, and between seating surface 840C and electrode 828, are of the greatest magnitudes.

Filter 780 of FIG. 10 differs from that of filter 80 of FIG. 3 in that bottom mounting surface 796 of FIG. 10 further includes laterally extending notch 846. The depth of notch 846 is defined by the height of sidewall 846A, which is of the same height as the heights of sidewalls 834A-B and 840A-B of notches 834 and 840, respectively. Seating surface 846B of notch 846 is thereby formed at an elevation above a face surface of bottom, mounting surface 796 similar to corresponding elevations of seating surfaces 834C and 840C of notches 834 and 840, respectively.

When filter 780 is positioned to extend through an opening formed by a recessed area extending into a circuit board (such as circuit board 382 of FIG. 6), seating surfaces 834C and 840C support a first side of filter 780, and seating surface 846B supports a second side of filter 780. As both sides of filter 780 are supported in position, the need for additional means of support, such as rod member 602 of FIG. 7 or bracket members 620 and 720 of FIGS. 8 and 9, respectively, is obviated.

Figure 10A:
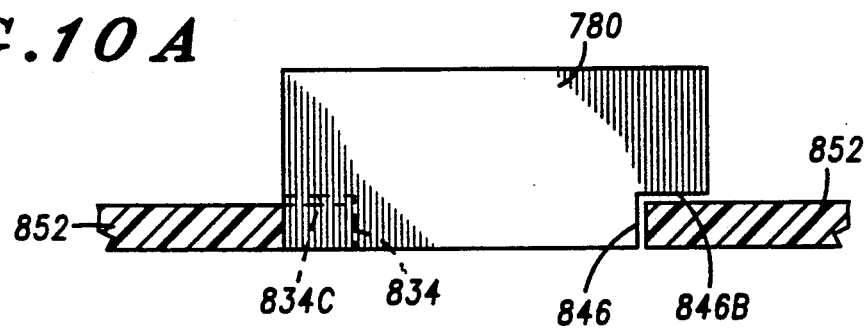
FIG. 10A is a sectional view of the filter shown in the perspective view of FIG. 10.

FIG. 10A is a sectional view of filter 780 illustrating positioning of the filter in supportive engagement thereof upon a circuit board. here referred to by reference numeral 852. Seating surface 834C of notch 834 (notch 834 is shown in hatch) abuts against a top surface of circuit board 852; seating surface 846B similarly abuts against a top surface of circuit board 852.

Figure 11:
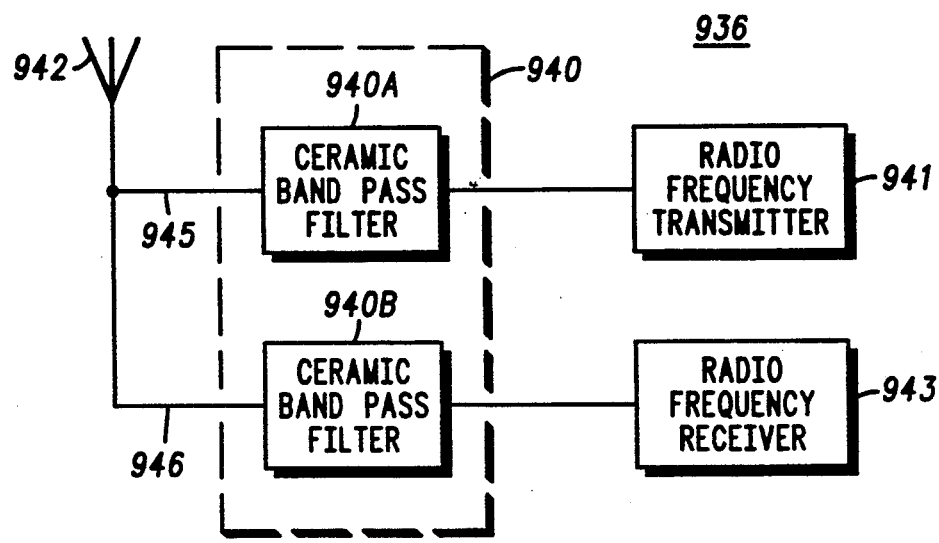
FIG. 11 is a block diagram of a transceiver including a filter constructed according to the teaching, of the present invention.

Turning finally to FIG. 11, transceiver 936 is shown in block form. Multi-band filter 940, shown in hatch, forms a portion of the transceiver. Multi-band filter 940 is constructed according to the teachings of the present invention and is similar in configuration to filters 80, 280, 380, 580, 680, and/or 780 shown in the preceding figures. Transceiver 936, may, for example, comprise a radio telephone such as a Motorola, Inc. DYNATAC (tm) cellular mobile telephone.

Filter 940 forms two intercoupled ceramic band pass filters 940A and 940B. Two or more of the ceramic band pass filters 940A and 940B may be intercoupled to provide apparatus that combines and/or frequency sorts two radio frequency signals into and/or from a composite radio frequency signal.

For example, and as illustrated by FIG. 11, filter 940 couples and transmits a signal from a radio frequency transmitter 941 to antenna 942, and a received signal from antenna 942 to radio frequency receiver 943. The filter arrangement of FIG. 11 may be advantageously utilized in a mobile, portable, or fixed station radio as an antenna duplexer. A transmit signal from radio frequency transmitter 941 is coupled to filter portion 940A and thereafter by transmission line 945 to antenna 942. Filter 940A is a ceramic band pass filter constructed according to the teachings of the present invention. The pass band of filter 940A is centered about the frequency of the transmit signal from radio frequency transmitter 941, while at the same time, greatly attenuating the frequency of the received signal. In addition, the length of transmission line 945 is selected to maximize the impedance thereof at the frequency of the received signal.

A received signal from antenna 942 of FIG. 11 is coupled by transmission line 946 to filter 940B and thereafter to radio frequency receiver 943. Filter 940B, which may be one of the filters constructed according to the teachings of the present invention, has a pass band centered about the frequency of the received signal, while at the same time greatly attenuating the transmit signal. Similarly, the length of transmission line 946 is selected to maximize the impedance thereof at the transmit signal frequency for further attenuating the transmit signal.

While the present invention has been described in connection with the preferred embodiments shown in the various figures, it is to be understood that other similar embodiments may be used and modifications and additions may be made to the described embodiments for performing the same functions of the present invention without deviating therefrom. Therefore, the present invention should not be limited to any single embodiment, but rather construed in breadth and scope in accordance with the recitation of the appended claims.

What is claimed is:

1. A filter assembly mountable upon a circuit board defined by a face surface and a bottom surface and having an opening extending through the circuit board between the face surface and the bottom surface thereof, the circuit board further having at least one projecting member projecting into the opening and having an electrically-conductive transmission line disposed thereupon, said filter assembly comprising:
a dielectric block defining a front surface, a rear surface, a bottom mounting surface, and first and second side surfaces, and having at least one resonator formed to extend essentially longitudinally along at least a portion of the length of the dielectric block with portions of the front surface, the rear surface, the bottom mounting surface, the first and second side surfaces, and sidewalls which define the at least one resonator being coated with an electrically-conductive material, said bottom mounting surface of dimensions permitting mated engagement with the opening extending through the circuit board and having: at least one front-side notch corresponding to the at least one projecting member, the at least one front-side notch defined by opposing sidewall surfaces and a front-side notch seating surface extending therebetween and formed at a side of the bottom mounting surface which interfaces with the front surface, and a laterally-extending notch formed at a side of the bottom mounting surface opposite that of the side of the bottom mounting surface at which the at least one front-side notch is formed, said laterally-extending notch comprising a laterally-extending sidewall and a laterally-extending seating surface; wherein the front-side notch seating surface and the laterally-extending seating surface are formed at similar elevations above the bottom mounting surface such that, when the bottom mounting surface of the dielectric block is positioned in the mated engagement with the opening extending through the circuit board, the laterally-extending seating surface and the front-side notch seating surface seat against the face surface of the circuit board.

2. The filter assembly of claim 1 wherein at least one of the surfaces defining the at least one front-side notch is coated with an electrically-conductive material to be coupled capacitively with the electrically-conductive material coating the sidewalls of defining the resonator.

3. The filter of claim 2 wherein the electrically-conductive material coating at least one of the surfaces defining the at least one notch is coated upon the front-side notch seating surface.

4. The filter assembly of claim 3 wherein the portions of the electrically-conductive transmission line disposed upon the at least one projecting member connect electrically with the electrically-conductive material coated upon the front-side notch seating surface when the seating surface seats against the face surface of the circuit board.

5. The filter assembly of claim 4 wherein the dielectric block wherein the at least one resonator is of a length to extend between the front and rear surfaces, respectively, of the dielectric block.

6. The filter assembly of claim 1 further comprising means for supporting the dielectric block when positioned in the mated engagement with the opening extending through the circuit board.

7. The filter assembly of claim 6 wherein said means for supporting the dielectric block comprises a bracket.

8. The filter assembly of claim 6 wherein the means for supporting comprises at least one rod member having first and second ends, wherein the first end of the at least one rod member extends into a resonator extending along at least a portion of the length of the dielectric block, and the second end of the at least one rod member seats against the top surface of the circuit board.

9. A circuit assembly comprising:
a printed circuit board having a generally planar face surface and a bottom surface and an opening extending through the printed circuit board between the face surface and the bottom surface thereof, said printed circuit board further having a first bar-shaped projecting member and a second bar-shaped projecting member, said first and second bar-shaped projecting members, respectively, being spaced-apart by a pre-determined distance and extending in parallel directions to project into the opening;

electrically-conductive transmission lines disposed upon at least top surfaces of the first and second bar-shaped portions of the printed circuit board;

a dielectric block defining a front surface, a rear surface, a bottom mounting surface, and first and second side surfaces, and having at least one resonator formed to extend essentially longitudinally along at least a portion of the length of the dielectric block with portions of the front surface, the rear surface, the bottom mounting surface, the first and second side surfaces, and sidewalls which define the at least one resonator being coated with an electrically-conductive material, said bottom mounting surface of dimensions permitting mated engagement with the opening extending through the circuit board and having: at least one front-side notch corresponding to the at least one projecting member, the at least one front-side notch defined by opposing sidewall surfaces and a front-side notch seating surface extending therebetween and formed at a side of the bottom mounting surface which interfaces with the front surface, and a laterally-extending notch formed at a side of the bottom mounting surface opposite that of the side of the bottom mounting surface at which the at least one front-side notch is formed, said laterally-extending notch comprising a laterally-extending sidewall and a laterally-extending seating surface; wherein the front-side notch seating surface and the laterally-extending seating surface are formed at similar elevations above the bottom mounting surface such that, when the bottom mounting surface of the dielectric block is positioned in the mated engagement with the opening extending through the circuit board, the laterally-extending seating surface and the front-side notch seating surface seat against the face surface of the circuit board; and a bracket for supporting the dielectric block when positioned at the opening in the mated engagement thereat.

10. In a transceiver having both receiver circuitry and transmitter circuitry disposed upon a printed circuit board, the printed circuit board defined by a face surface and a bottom surface and having an opening extending through the printed circuit board between the face surface and the bottom surface thereof, the printed circuit board further having at least one projecting member projecting into the opening and having an electrically-conductive transmission line disposed thereupon, the combination with the receiver circuitry and the transmitter circuitry of a filter assembly coupled to the receiver circuitry and the transmitter circuitry by way of the transmission line, said filter assembly comprising:

a dielectric block defining a front surface, a rear surface, a bottom mounting surface, and first and second side surfaces, and having at least one resonator formed to extend essentially longitudinally along at least a portion of the length of the dielectric block with portions of the front surface, the rear surface, the bottom mounting surface, the first and second side surfaces, and sidewalls which define the at least one resonator being coated with an electrically-conductive material, said bottom mounting surface of dimensions permitting mated engagement with the opening extending through the printed circuit board and having: a first front-side notch and a second front-side notch corresponding to the first bar-shaped projecting member and the second bar-shaped projecting member, the first and second front-side notches, respectively, each defined by opposing sidewall surfaces and a front-side notch seating surface extending therebetween and each formed at a side of the bottom mounting surface which interfaces with the front surface, and a laterally-extending notch formed at a side of the bottom mounting surface opposite that of the side of the bottom mounting surface at which the first and second front-side notches are formed, said laterally-extending notch comprising a laterally-extending sidewall and a laterally-extending seating surface; wherein the front-side notch seating surfaces of the first and second front side notches and the laterally-extending seating surface are formed at similar elevations above the bottom mounting surface such that, when the bottom mounting surface of the dielectric block is positioned in the mated engagement with the opening extending through the printed circuit board, the laterally-extending seating surface and the front-side notch seating surfaces seat against the face surface of the printed circuit board.

* * * * *